United States Patent
Yang

(10) Patent No.: US 9,362,867 B2
(45) Date of Patent: Jun. 7, 2016

(54) AMPLIFICATION CIRCUIT ADJUSTING DUTY CYCLE OF OUTPUT SIGNAL

(71) Applicant: SK hynix Inc., Icheon-si Gyeonggi-do (KR)

(72) Inventor: Jae Mo Yang, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/458,386

(22) Filed: Aug. 13, 2014

(65) Prior Publication Data

US 2015/0326189 A1    Nov. 12, 2015

(30) Foreign Application Priority Data

May 8, 2014   (KR) .......................... 10-2014-0054926

(51) Int. Cl.
| | |
|---|---|
| H03F 3/45 | (2006.01) |
| H03F 1/02 | (2006.01) |
| H03F 1/30 | (2006.01) |
| H03F 3/16 | (2006.01) |
| H03F 3/185 | (2006.01) |

(52) U.S. Cl.
CPC .. *H03F 1/30* (2013.01); *H03F 3/16* (2013.01); *H03F 3/185* (2013.01); *H03F 2200/375* (2013.01)

(58) Field of Classification Search
CPC ..................................... H03F 3/45; H03F 1/02
USPC ....................................................... 330/253, 9
See application file for complete search history.

(56) References Cited

U.S. PATENT DOCUMENTS

2012/0086488 A1    4/2012   Willey

FOREIGN PATENT DOCUMENTS

KR       1020120070426 A      6/2012

*Primary Examiner* — Patricia T Nguyen
(74) *Attorney, Agent, or Firm* — William Park & Associates Ltd.

(57) ABSTRACT

An amplification circuit includes an input portion, a first load portion, a second load portion, and a duty cycle adjustment portion. The input portion changes a voltage level of an output node, which outputs a voltage level thereof as an output signal, in response to an input signal. The first load portion and a second load portion are coupled to the output node. The duty cycle adjustment portion is coupled between the first load portion and the second load portion, and provides a correction current to the output node.

20 Claims, 5 Drawing Sheets

AMPLIFICATION CIRCUIT ADJUSTING DUTY CYCLE OF OUTPUT SIGNAL

CROSS-REFERENCES TO RELATED APPLICATION

The present application claims priority under 35 U.S.C. §119(a) to Korean application number 10-2014-0054926 filed on May 8, 2014 in the Korean Intellectual Property Office, which is incorporated herein by reference in its entirety.

BACKGROUND

1. Technical Field

Embodiments of the present invention generally relate to a semiconductor apparatus, and more particularly, in one or more embodiments, to an amplification circuit capable of buffering or amplifying an input signal and a system using the same.

2. Related Art

In an electronic system in which one device (e.g., master device) controls the other devices (e.g., slave device), the master device sends a control signal and data to the slave device through a plurality of buses, and the slave device sends data to the master device through a plurality of buses.

As described above, the master device and the slave device operate in response to signals transmitted from the other device. In general, the master device includes a reception circuit for receiving a signal transmitted from the slave device, and the slave device includes a reception circuit for receiving a signal transmitted from the master device.

The reception circuit may include an amplification circuit capable of buffering and/or amplifying the transmitted signal. The reception circuit may amplify an input signal, which is the signal transmitted from the other device, and generate an output signal, which may be transferred to an internal circuit of the device receiving the input signal.

The output signal being generated from the input signal at to amplification circuit must be in an allowable range so that the control signals and data can, without error, be transferred between the master device and the slave device. However, various factors such as process variation and voltage variation may cause errors.

SUMMARY

In an embodiment of the present invention, an amplification circuit may include an output node configured to output a voltage level thereof as an output signal, an input portion configured to change the voltage level of the output node in response to an input signal, a first load portion and a second load portion coupled to the output node, and a duty cycle adjustment portion coupled between the first load portion and the second load portion and configured to provide a correction current to the output node.

In an embodiment of the present invention, an amplification circuit may include an output node configured to output a voltage level thereof as an output signal, an input portion coupled to a first voltage supply node, and configured to change the voltage level of the output node in response to an input signal, first and second load portions coupled to each other, wherein the first load portion is coupled to the output node and the second load portion is coupled to a second voltage supply node, and a duty cycle adjustment portion coupled to the output node through the first load portion, and configured to provide a correction current.

In an embodiment of the present invention, an amplification to circuit may include an output node configured to output a voltage level thereof as an output signal, a duty cycle adjustment portion configured to provide a duty correction current to the output node, and a first load portion configured to electrically connect the output node and the duty cycle adjustment portion and provide an indirect electrical-connection between the output node and the duty cycle adjustment portion.

BRIEF DESCRIPTION OF THE DRAWINGS

Features, aspects and embodiments are described in conjunction with the attached drawings, in which.

DETAILED DESCRIPTION

Figure 1:
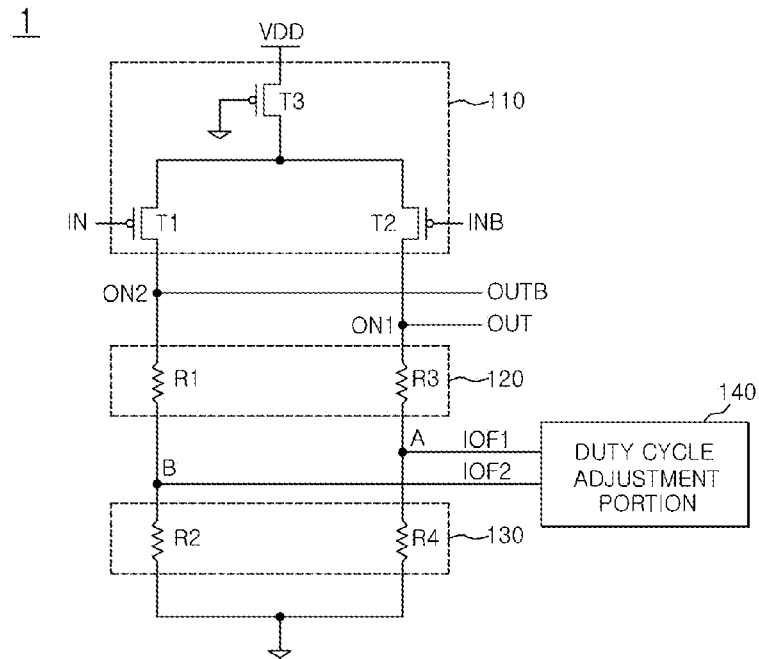
FIG. 1 is a circuit diagram illustrating an amplification circuit in accordance with an embodiment of the present invention.

Referring to FIG. 1, an amplification circuit 1 in accordance is with an embodiment of the present invention may include an input portion 110, a first load portion 120, a second load portion 130, and a duty cycle adjustment portion 140. The amplification circuit 1 may receive input signals IN and INB, and generate output signals OUT and OUTB in response to the input signals IN and INB. For example, the input portion 110 may receive the input signals IN and INB, and change voltage levels of output nodes ON1 and ON2 in response to the input signals IN and INB. Referring to FIG. 1, the input portion 110 may be electrically coupled to a first voltage node, which is a node where the amplification circuit 1 receives a power supply voltage VDD, and may change voltage levels of output nodes ON1 and ON2 by adjusting amounts of currents flowing to the output nodes ON1 and ON2 according to the input signals IN and INB. The output signals OUT and OUTB may be generated from the output nodes ON1 and ON2. For example, the levels of output signals OUT and OUTB are voltage levels of the output nodes ON1 and ON2.

The first load portion 120 and the second load portion 130 may be electrically coupled to each other through a plurality of nodes A and B. In an embodiment of the present invention, the first load portion 120 and the second load portion 130 may be electrically connected in parallel. The first load portion 120 may be coupled to the output nodes ON1 and ON2 and the nodes A and B. The second load portion 130 may be coupled to the nodes A and B and a second voltage node which is a node where the amplification circuit 1 receives a ground voltage.

The duty cycle adjustment portion 140 may be electrically coupled to the nodes A and B, which are in between the first and second load portions 120 and 130, in parallel. The duty cycle adjustment portion 140 may be electrically coupled to the first load portion 120 and the second load portion 130 in parallel. The duty cycle adjustment portion 140 may provide correction currents IOF1 and IOF2 to the nodes A and B which are in between the first load portion 120 and the second load portion 130. The duty cycle adjustment portion 140 may be electrically coupled to the output nodes ON1 and ON2 through the first load portion 120. In other words, the duty cycle adjustment portion 140 is not directly connected to the output nodes ON1 and ON2. Therefore, even if the duty cycle adjustment portion 140 has high impedance, the configuration described above may minimize the impedance variation at the output nodes ON1 and ON2, which may be induced by the duty cycle adjustment portion 140.

Referring to FIG. 1, resistance value of the first load portion 120 may be higher than that of the second load portion 130. Basically, the impedance of the output nodes ON1 and ON2 may be determined by the resistance values of the first load portion 120 and to the second load portion 130. When the resistance value of the first load portion 120 is set to be higher than the resistance value of the second load portion 130, an impedance variation at the output nodes ON1 and ON2, which may be induced by the duty cycle adjustment portion 140, may be minimized, even in the case where the duty cycle adjustment portion 140 has high impedance.

Referring to FIG. 1, the input signals IN and INB may include a first input signal IN, and a second input signal INB. The output signals OUT and OUTB may include a first output signal OUT, and a second output signal OUTB. Also, the output nodes ON1 and ON2 may include a first output node ON1 for outputting the first output signal OUT, and a second output node ON2 for outputting the second output signal OUTB. The input portion 110 may include a first transistor T1, a second transistor T2, and a third transistor T3. The first to third transistors T1 to T3 may be PMOS transistors. The input signals IN and INB may include the first input signal IN, and the second input signal INB. The first transistor T1 may receive the first input signal IN at a gate thereof. A source of the first transistor T1 may be electrically coupled to a drain of the third transistor T3. A drain of the first transistor T1 may be electrically coupled to the second output node ON2. The second transistor T2 may receive the second input signal INB at a gate thereof. A source of the second transistor T2 may be electrically coupled to the drain of the third transistor T3. A drain of the second transistor T2 may be electrically coupled to the first output node ON1. The third transistor T3 may be electrically coupled to the ground voltage at a gate thereof, coupled to a power supply voltage VDD at a source thereof, and coupled to the sources of the first and second transistors T1 and T2 at a drain thereof.

The first load portion 120 may include a first resistor R1 and is a third resistor R3, and the second load portion 130 may include a second resistor R2 and a fourth resistor R4. The first resistor R1 and the third resistor R3 may have the same resistance value as each other, and the second resistor R2 and the fourth resistor R4 may have the same resistance value as each other. The first resistor R1 may be electrically coupled between the second output node ON2 and the second resistor R2, and the second resistor R2 may be electrically coupled between the first resistor R1 and a ground voltage. The third resistor R3 may be electrically coupled between the first output node ON1 and the fourth resistance R4, and the fourth resistor R4 may be electrically coupled between the third resistor R3 and the ground voltage. The duty cycle adjustment portion 140 may have electrical connections to a node A, which is a connection point of the third resistance R3 and the fourth resistor R4, and to a node B, which is a connection point of the first resistor R1 and the second resistor R2.

The amplification circuit 1 may receive differential signals, and output differential signals. For example, the second input signal INB may be a complementary signal of the first input signal IN. Similarly, the second output signal OUTB may be a complementary signal of the first output signal OUT. When the amplification circuit 1 to receives the first input signal IN having a low level, and the second input signal INB having a high level, the first transistor T1 may be turned on, and the second transistor T2 may be turned off. In this situation, relatively greater amount of current may flow to the second output node ON2 than to the first output node ON1. As a result, voltage level of the second output node ON2 may be a high level, and voltage level of the first output node ON1 may be a low level. Therefore, the first output signal OUT having a low level may be generated at the first output node ON1, and the second output signal OUTB having a high level may be generated at the second output node ON2. The duty cycle adjustment portion 140 may maintain duty cycles of the first and second output signals OUT and OUTB within an allowable range by providing the correction currents IOF1 and IOF2 to the nodes A and B which are connecting nodes of the first load portion 120 and the second load portion 130. Also, the amplification circuit 1 may generate output signals OUT and OUTB which are within an allowable range by having the first load portion 120 in between the first and second output nodes ON1 and ON2 and the duty cycle adjustment portion 140. By indirectly connecting the duty cycle adjustment portion 140, influence of the duty cycle adjustment portion with respect to impedance at the first and second output nodes ON1 and ON2 may be minimized.

Figure 2:
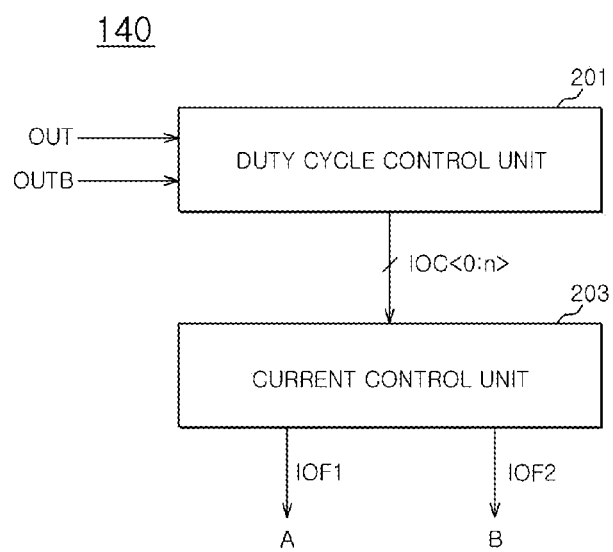
FIG. 2 is a block diagram illustrating a duty cycle adjustment portion shown in FIG. 1.

FIG. 2 is a block diagram illustrating the duty cycle adjustment portion 140 shown in FIG. 1. Referring to FIG. 2, the duty cycle adjustment portion 140 may include a duty cycle control to unit 201, and a current control unit 203. The duty cycle control unit 201 may generate current offset control signals IOC<0:n>. In an embodiment of the present invention, the duty cycle control unit 201 may generate the current offset control signals IOC<0:n> in response to the output signals OUT and OUTB. The duty cycle control unit 201, which received the output signals OUT and OUTB, may detect duty cycles of the output signals OUT and OUTB and then generate the current offset control signals IOC<0:n> based on the detection result. In an embodiment of the present invention, the duty cycle control unit 201 may generate the current offset control signals IOC<0:n> without receiving the output signals OUT and OUTB. The duty cycle control unit 201 may generate the current offset control signals IOC<0:n> having various logic values using, for example, a random number generation device.

The current control unit 203 may generate the correction currents IOF1 and IOF2 in response to the current offset control signals IOC<0:n>. The current control unit 203 may include a plurality of drivers. The current control unit 203 may change the correction currents IOF1 and IOF2 in response to the current offset control signals IOC<0:n>.

Figure 3:
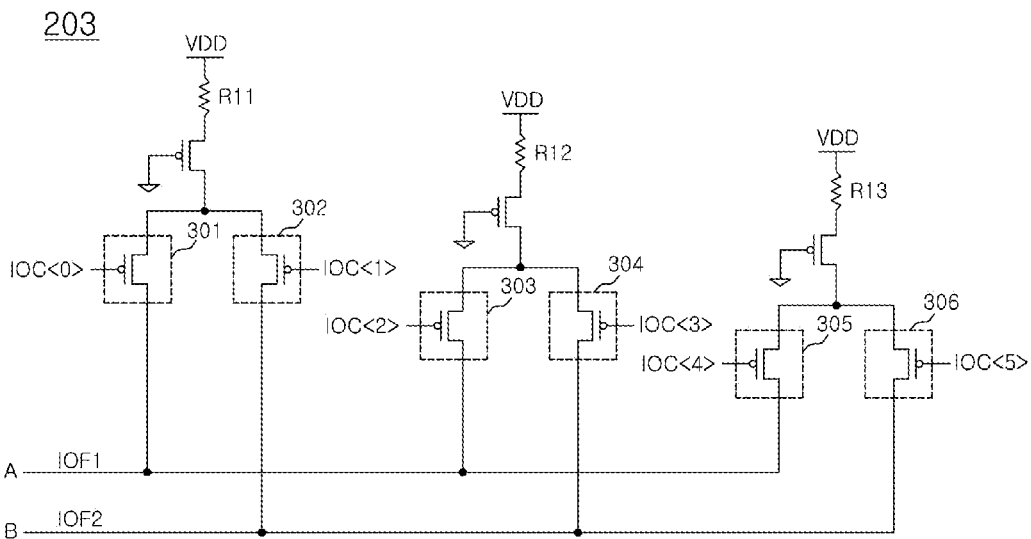
FIG. 3 is a circuit diagram illustrating a current control unit shown in FIG. 2.

FIG. 3 is a circuit diagram illustrating the current control unit 203 shown in FIG. 2. Referring to FIG. 3, the current control unit 203 may include first to sixth drivers 301 to 306, and first to third resistors R11 to R13. The first driver 301 may receive the first current offset control signal IOC<0>, the third driver 303 may receive the third current offset control signal IOC<2>, and the fifth driver 305 may receive the fifth current offset control signal IOC<4>. The first driver 301, the third driver 303, and the fifth driver 305 may be electrically coupled to the node A in common, and may provide the correction current IOF1 to the node A. The second driver 302 may receive the second current offset control signal IOC<1>, the fourth driver 304 may receive the fourth current offset control signal IOC<3>, and the sixth driver 306 may receive the sixth current offset control signal IOC<5>. The second driver 302, the fourth driver 304, and the sixth driver 306 may be electrically coupled to the node B in common, and may provide the correction current IOF2 to the node B.

The first and second drivers 301 and 302 may be electrically coupled to the first resistor R11 in common, the third and fourth drivers 303 and 304 may be electrically coupled to the second resistor R12 in common, and the fifth and sixth drivers 305 and 306 may be electrically coupled to the third resistor R13 in common. In an embodiment of the present invention, the first to third resistors R11 to R13 may have the same resistance value as each other. In an embodiment of the present invention, the second resistor R12 may have lower resistance value than the first resistor R11, and the third resistor R13 may have lower resistance value than the second resistor R12. Each of the first to third resistors R11 to R13 may be electrically coupled to a power supply voltage VDD. In this situation, the first and second drivers 301 and 302 may provide current, which is smaller than that of the third to sixth drivers 303 to 306, as the to correction currents IOF1 and IOF2 in response to the first and second current offset control signal IOC<0:1>, and the fifth and sixth drivers 305 and 306 may provide current, which is larger than that of the first to fourth drivers 301 to 304, as the correction currents IOF1 and IOF2 in response to the fifth and sixth current offset control signal IOC<4:5>. The current provided to each of the nodes A and B may vary depending on the first to third resistors R11 to R13 and the first to sixth drivers 301 to 306.

Figure 4:
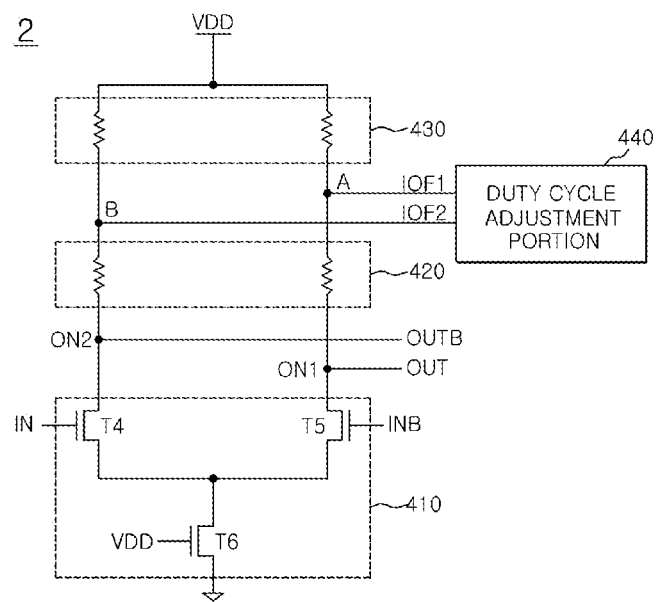
FIG. 4 is a circuit diagram illustrating an amplification circuit in accordance with an embodiment of the present invention.

FIG. 4 is a circuit diagram illustrating an amplification circuit 2 in accordance with an embodiment of the present invention. Referring to FIG. 4, the amplification circuit 2 in accordance with an embodiment of the present invention may include the input portion 410, the first load portion 420, the second load portion 430, and a duty cycle adjustment portion 440. The input portion 410 may include fourth to sixth transistors T4 to T6. The fourth transistor T4 may receive the first input signal IN at a gate thereof, and a source of the fourth transistor T4 may be electrically coupled to a drain of the sixth transistor T6. The fifth transistor T5 may receive the second input signal INB at a gate thereof, and a source of the fifth transistor T5 may be electrically coupled to the drain of the sixth transistor T6. The sixth transistor T6 may be electrically coupled to a power supply voltage VDD at a gate thereof, coupled to a ground voltage at a source thereof, and coupled to the sources of the fourth and fifth transistors T4 and T5 at a drain thereof. The fourth to sixth transistors T4 to T6 may be NMOS transistors.

Each of the first and second load portions 420 and 430 may include a plurality of resistors. For example, the first load portion may include two resistors electrically connected to a power supply voltage VDD in parallel. The second load portion 430 may include two resistors each electrically connected to each of the resistors in the first load portion 420. The first load portion 420 may be electrically coupled to the output nodes ON1 and ON2, and the second load portion 430. The second load portion 430 may be electrically coupled to the first load portion 420 through a plurality of nodes A and B. The duty cycle adjustment portion 440 electrically coupled to the first load portion 420 and the second load portion 430 through a plurality of nodes A and B and may provide correction currents IOF1 and IOF2 to the nodes A and B.

Figure 5:
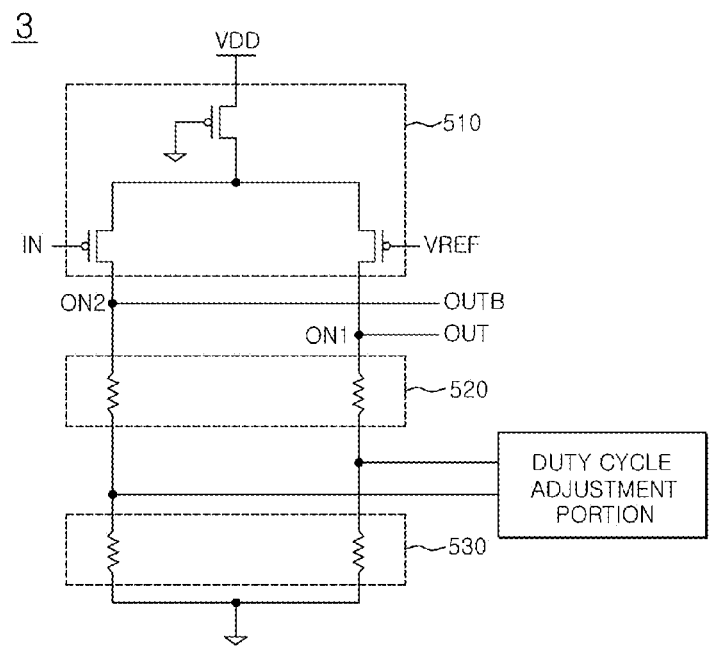
FIG. 5 is a circuit diagram illustrating an amplification circuit in accordance with an embodiment of the present invention.

FIG. 5 is a circuit diagram illustrating an amplification circuit 3 in accordance with an embodiment of the present invention. Referring to FIG. 5, the amplification circuit 3 may include the input portion 510, the first load portion 520, and the second load portion 530. Each of the first and second load portions 520 and 530 may include a plurality of resistors. For example, the second load portion 530 may include two resistors electrically connected to a ground voltage in parallel. The first load portion 530 may include two resistors each electrically connected to each of the resistors in the second load portion 520. The amplification circuit 3 may receive single ended signal, and output the differential signals. Referring to FIG. 1, the input portion 110 of the amplification circuit 1 may receive the first input signal IN and the second input signal INB, which is the differential signal of the first input signal IN. However, referring to FIG. 5, an input portion 510 of the amplification circuit 3 may receive the first input signal IN and a reference voltage VREF. The reference voltage VREF may have a voltage level between a high level and a is low level. Therefore, when the first input signal IN has a low level, the voltage level of the second output node ON2 may become higher, the first output signal OUT having a low level may be generated at the first output node ON1, and the second output signal OUTB having a high level may be generated at the second output node ON2. On the other hand, when the first input signal IN has a high level, the voltage level of the first output node ON2 may become lower, the first output signal OUT having a high level may be generated at the first output node ON1, and the second output signal OUTB having a low level may be generated at the second output node ON2.

Figure 6:
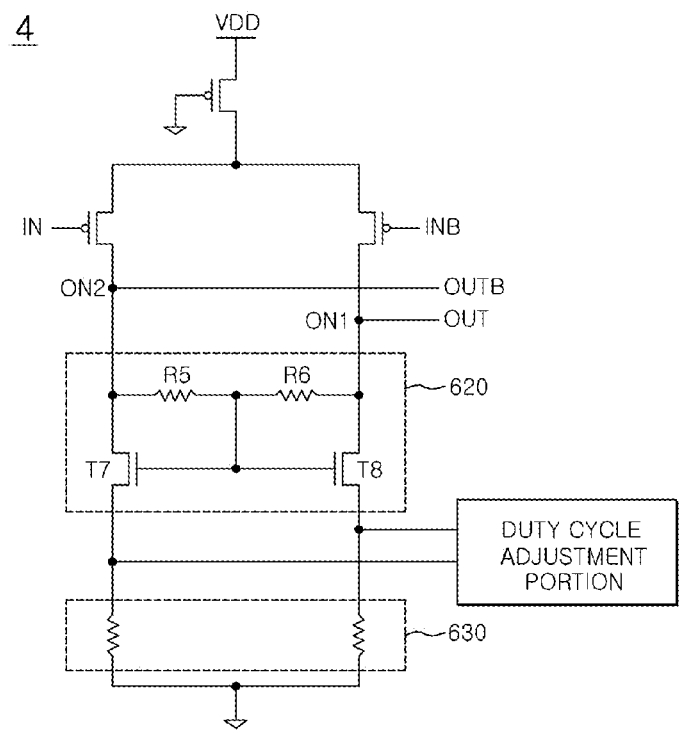
FIG. 6 is a circuit diagram illustrating an amplification circuit in accordance with an embodiment of the present invention.

FIG. 6 is a circuit diagram illustrating an amplification circuit 4 in accordance with an embodiment of the present invention. Referring to FIG. 6, the first load portion 620 may include a fifth resistor R5, a sixth resistor R6, a seventh transistor T7, and an eighth transistor T8. A first node of the fifth resistor R5 may be electrically coupled to the second output node ON2, and a drain of the seventh transistor T7. A first node of the sixth resistor R6 may be electrically coupled to the first output node ON1, and a drain of the eighth transistor T8. The gate of the seventh transistor T7, the gate of the eighth transistor T8, a second node of the fifth resistor R5, and a to second node of the sixth resistor R6 may be electrically coupled to each other in common. Sources of the seventh and eighth transistors T7 and T8 may be electrically coupled to the resistors of a second load portion 630, respectively.

Figure 7:
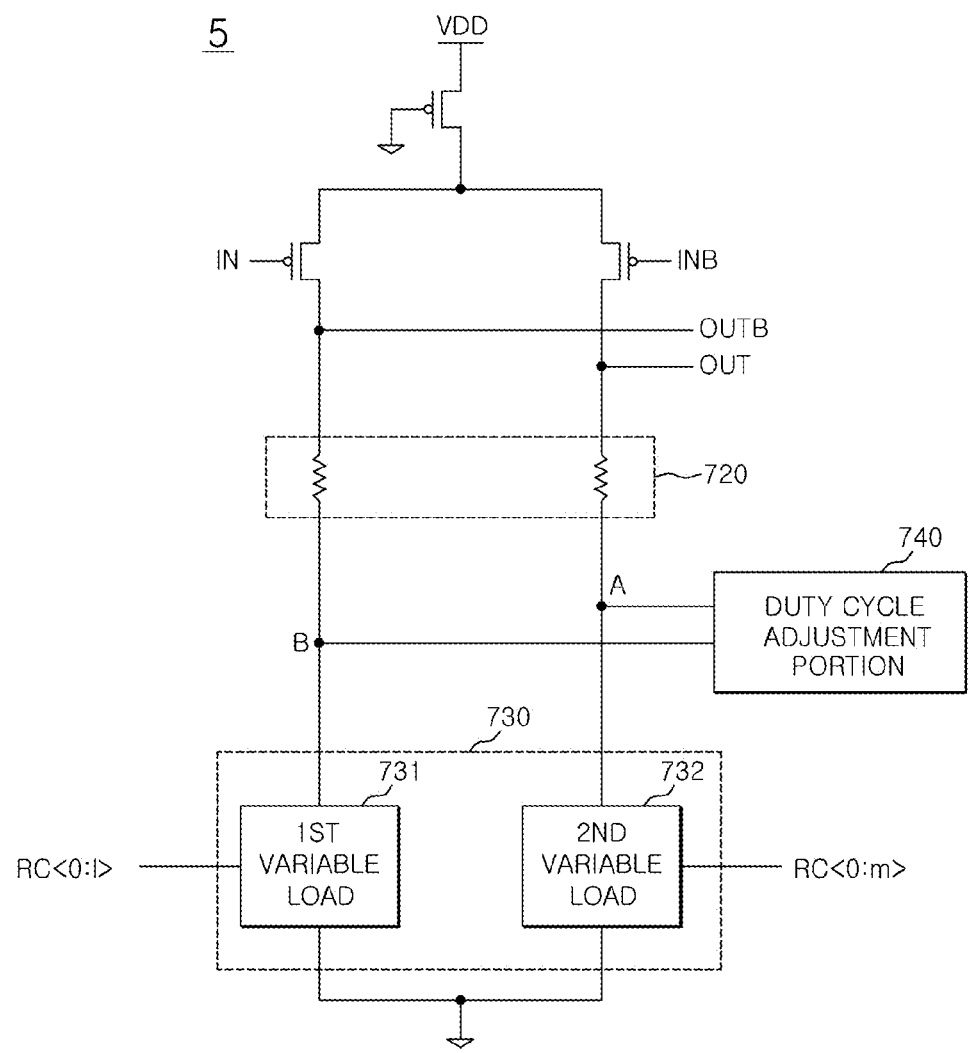
FIG. 7 is a circuit diagram illustrating an amplification circuit in accordance with an embodiment of the present invention.

FIG. 7 is a circuit diagram illustrating an amplification circuit 5 in accordance with an embodiment of the present invention. Referring to FIG. 7, the second load portion 730 may include a first variable load 731, and a second variable load 732. The first variable load 731 may be electrically coupled to a first load portion 720 and a duty cycle adjustment portion 740 through the node B. The second variable load 732 may be electrically coupled to the first load portion 720 and the duty cycle adjustment portion 740 through the node A. The first and second variable loads 731 and 732 may be electrically coupled to a ground voltage in common. The first variable load 731 may receive a first variable resistance code RC<0:l> (l is a natural number), and may have a variable resistance value varying in response to the first variable resistance code RC<0:l>. The second variable load 732 may receive a second variable resistance code RC<0:m> (m is a natural number), and may have a variable resistance value varying in response to the second variable resistance code RC<0:m>. In an embodiment of the present invention, the first and second variable resistance codes RC<0:l> and RC<0:m> may be generated on the basis of detection result of duty cycles of the output signals OUT and OUTB. In an embodiment of the present invention, the first and second variable resistance codes RC<0:l> and RC<0:m> may be inputted from an external controller, or may be implemented by a test mode signal. Although not illustrated in FIG. 7, the first variable load 731 and the second variable load 732 may include a resistor having a unit resistance, and may include a plurality of resistance legs, which may be turned on in response to each of the first and second variable resistance codes RC<0:l> and RC<0:m>. The amplification circuit 5 may adjust the duty cycles of the output signals OUT and OUTB by changing the amount of current flowing to the nodes A and B through the duty cycle adjustment portion 740, and changing resistance values of the first and second variable loads 731 and 732.

Figure 8:
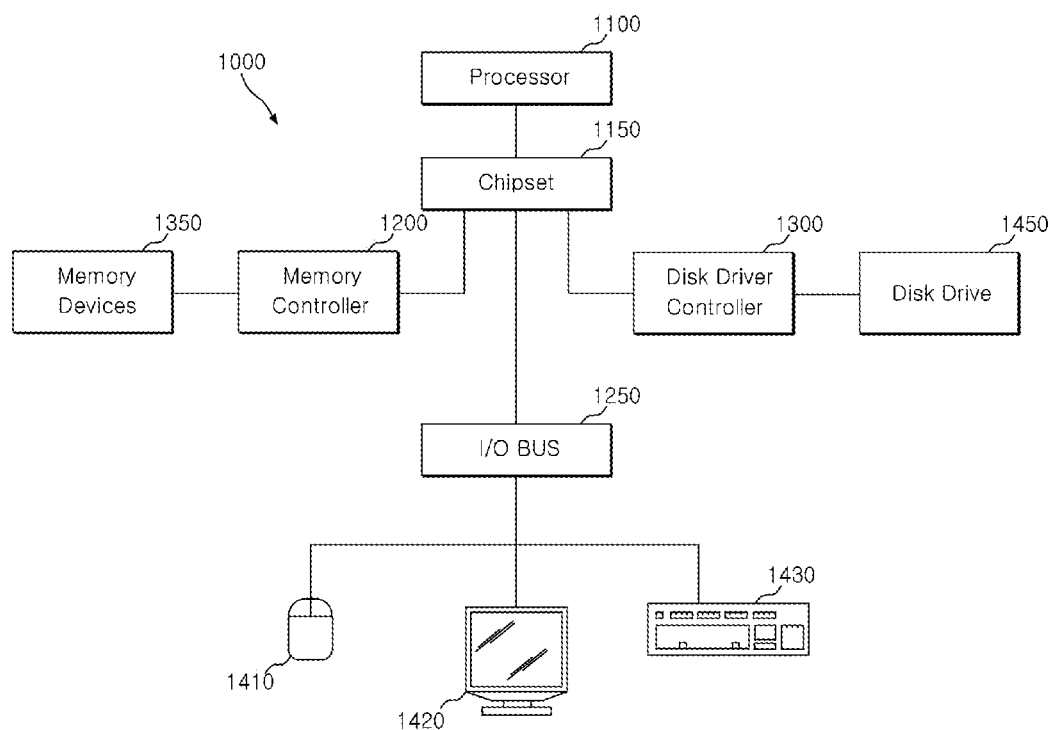
FIG. 8 is a schematic block diagram illustrating a system in accordance with an embodiment of the present invention.

FIG. 8 is a schematic block diagram illustrating a system 1000 in accordance with an embodiment of the present invention. Referring to FIG. 8, the system 1000 may include a processor 1100, a memory controller 1200, and memory devices 1350. The processor 1100 may be electrically coupled to the memory controller 1200 through a chip set 1150, and the memory controller 1200 may be electrically coupled to the memory devices 1350 through a plurality of buses. FIG. 7 shows a single processor 1100 as an example. However the present invention is not limited to the single processor 1100, and the system 1000 in accordance with an embodiment of the present invention may include a plurality of physical or logical processors. The chip set 1150 may provide communication path for signal transfer between the processor 1100 and the memory controller 1200. The processor 1100 may perform an arithmetic operation, and transmit request and/or data to the memory controller 1200 through the chip set 1150 in order to input and output data.

The memory controller 1200 may transmit command signal, address signal, clock signal, and data through the plurality of buses. The memory devices 1350 may receive the signals from the memory controller 1200, store data, and output the stored data to the memory controller 1200. The memory apparatus 1350 may include a volatile memory device such as a dynamic random access memory (DRAM) or a nonvolatile memory device such as a flash memory, a phase change random access memory (PCRAM), a resistive random access memory (ReRAM), a ferroelectric random access memory (FeRAM), a magnetic random access memory (MRAM) and a Spin Transfer Torque random access memory (STTRAM). Also, the memory apparatus 1350 may comprise a combination of two or more of the volatile memory device and the nonvolatile memory device.

Between the processor 1100 and the memory controller 1200, the processor 1100 may be a master device, and the memory controller 1200 may be a slave device. Each of the processor 1100 and the memory controller 1200 may include a reception circuit for receiving a signal transmitted from the other device since the processor 1100 and the memory controller 1200 may transmit and receive request and data to and from each other. The reception circuit may include the amplification circuits 1 to 4 described above with reference to FIGS. 1 to 7.

Between the memory controller 1200 and the memory apparatus 1350, the memory controller 1200 may be a master device, and the memory apparatus 1350 may be a slave device. Each of the memory controller 1200 and the memory apparatus 1350 may include a reception circuit for receiving a signal transmitted from the other device since the memory controller 1200 may transmit command signal, address signal, clock signal, and data to the memory apparatus 1350, and the memory apparatus 1350 may transmit data to the memory controller 1200. The reception circuit may include the amplification circuits 1 to 4 described above with reference to FIGS. 1 to 7.

Referring to FIG. 8, the system 1000 may further include an input/output bus 1250, input/output devices 1410, 1420, and 1430, a disk driver controller 1300, and a disk drive 1450. The chip set 1150 may be electrically coupled to the input/output bus 1250. The input/output bus 1250 may provide communication path for signal transfer from the chip set 1150 to the input/output devices 1410, 1420, and 1430. The input/output devices 1410, 1420, and 1430 may include a mouse 1410, a video display 1420, or a keyboard 1430. The input/output bus 1250 may include any protocol capable of communicating with the input/output devices 1410, 1420, and 1430. Also, the input/output bus 1250 may be integrated inside the chip set 1150.

The disk driver controller 1300 may perform operation while being connected to the chip set 1150. The disk driver controller 1300 may provide communication path for signal transfer between the chip set 1150 and one or more of the disk drives 1450. The disk drive 1450 may serve as an external data storage device by storing commands and data. The disk driver controller 1300 and the disk drive 1450 may communicate with each other or with the chip set 1150 using any protocol including the input/output bus 1250.

While certain embodiments have been described above, it will be understood to those skilled in the art that the embodiments described are by way of example only. Accordingly, the amplification circuit capable of buffering or amplifying an input signal should not be limited based on the described embodiments. Rather, the amplification circuit capable of buffering or amplifying an input signal described herein should only be limited in light of the claims that follow when taken in conjunction with the above description and accompanying drawings.

What is claimed is:

1. An amplification circuit comprising:
   an output node configured to output a voltage level thereof as an output signal;
   an input portion configured to change the voltage level of the output node in response to an input signal;
   a first load portion and a second load portion coupled to the output node; and
   a duty cycle adjustment portion coupled between the first load portion and the second load portion and configured to provide a correction current to the output node through the first load portion.

2. The amplification circuit of claim 1, wherein a resistance value of the first load portion is greater than a resistance value of the second load value.

3. The amplification circuit of claim 1, wherein the duty cycle adjustment portion comprises:
   a duty cycle control unit configured to generate a current offset control signal; and
   a current control unit configured to generate the correction current in response to the current offset control signal.

4. The amplification circuit of claim 3, wherein the duty cycle control unit receives the output signal, detects duty cycle of the output signal, and generates the current offset control signal.

5. The amplification circuit of claim 3, wherein the current control unit comprises a plurality of drivers configured to provide various amount of current in response to the current offset control signal.

6. The amplification circuit of claim 1, wherein the second load portion has a resistance value varying in response to a variable resistance code.

7. An amplification circuit comprising:
  an output node configured to output a voltage level thereof as an output signal;
  an input portion coupled to a first voltage supply node, and configured to change the voltage level of the output node in response to an input signal;
  first and second load portions coupled to each other, wherein the first load portion is coupled to the output node and the second load portion is coupled to a second voltage supply node; and
  a duty cycle adjustment portion coupled to the output node through the first load portion, and configured to provide a correction current to the output node through the first load portion.

8. The amplification circuit of claim 7,
  wherein the first load portion is coupled to the output node at a first node thereof, and to a first node of the second load portion at a second node thereof, and
  wherein the second load portion is coupled to the second voltage node at a second node thereof.

9. The amplification circuit of claim 8, wherein a resistance value of the first load portion is greater than a resistance value of the second load value.

10. The amplification circuit of claim 8, wherein the duty cycle adjustment portion is coupled to a node which connects the first load portion and the second load portion.

11. The amplification circuit of claim 7, wherein the duty cycle adjustment portion comprises:
  a duty cycle control unit configured to generate a current offset control signal; and
  a current control unit configured to generate the correction current in response to the current offset control signal.

12. The amplification circuit of claim 11, wherein the duty cycle control unit receives the output signal, detects duty cycle of the output signal, and generates the current offset control signal.

13. The amplification circuit of claim 11, wherein the current control unit comprises a plurality of drivers configured to provide various amount of current in response to the current offset control signal.

14. The amplification circuit of claim 7, wherein the second load portion has a resistance value varying in response to a variable resistance code.

15. An amplification circuit comprising:
  an output node configured to output a voltage level thereof as an output signal;
  a duty cycle adjustment portion configured to provide a duty correction current to the output node; and
  a first load portion configured to electrically connect the output node and the duty cycle adjustment portion and provide an indirect electrical-connection between the output node and the duty cycle adjustment portion,
  wherein the duty cycle adjustment portion provides the duty correction current to the output node through the first load portion.

16. The amplification circuit of claim 15, wherein the output node comprises a first output node, which is configured to output an output signal, and a second output node, which is configured to output a complementary signal of the output signal.

17. The amplification circuit of claim 16, wherein the first load portion comprises a first resistor, which is connected to the first output node, and a second resistor, which is connected to the second output node.

18. The amplification circuit of claim 16, wherein the first load portion comprises a first transistor, a drain of which is connected to the first output node, a second transistor, a drain of which is connected to the second output node, a first resistor, which connects the first output node to gates of the first and second transistors, and a second resistor, which connects the second output node to the gates of the first and second transistors.

19. The amplification circuit of claim 15, wherein the duty cycle adjustment portion comprises:
  a duty cycle control unit configured to generate a current offset control signal; and
  a current control unit configured to generate the correction current in response to the current offset control signal.

20. The amplification circuit of claim 15, wherein the duty cycle control unit receives the output signal, detects duty cycle of the output signal, and generates the current offset control signal, and wherein the current control unit comprises a plurality of drivers configured to provide various amount of current in response to the current offset control signal.

* * * * *